(12) United States Patent
Li

(10) Patent No.: US 9,305,647 B2
(45) Date of Patent: Apr. 5, 2016

(54) WRITE OPERATION METHOD AND DEVICE FOR PHASE CHANGE MEMORY

(71) Applicant: Huawei Technologies Co., Ltd., Shenzhen (CN)

(72) Inventor: Yansong Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/532,196

(22) Filed: Nov. 4, 2014

(65) Prior Publication Data

US 2015/0117096 A1 Apr. 30, 2015

Related U.S. Application Data

(63) Continuation of application No. PCT/CN2014/076532, filed on Apr. 29, 2014.

(30) Foreign Application Priority Data

Oct. 31, 2013 (CN) .......................... 2013 1 0534736

(51) Int. Cl.
*G11C 8/08* (2006.01)
*G11C 7/06* (2006.01)
(Continued)

(52) U.S. Cl.
CPC ............ *G11C 13/0069* (2013.01); *G11B 7/004* (2013.01); *G11B 11/10504* (2013.01); (Continued)

(58) Field of Classification Search
CPC .......... H03F 2200/471; H03F 2200/78; H03F 2203/45522; H03F 2203/45528; H03F 2203/45591; H03F 2203/45594; H03F 2203/45616; H03F 2203/45618; H03F 3/45475; G11B 19/041; G11B 20/0092; G11B 20/10027; G11B 20/1879; G11B 7/00458; G11B 11/10504; G11C 13/0004; G11C 13/0064; G11C 13/0069; G11C 2013/0054; G11C 13/0026; G11C 13/0028; G11C 13/003; G11C 13/0035; G11C 13/0038; G11C 13/004; G11C 13/0061; G11C 2013/0066; G11C 2013/0076; G11C 2013/0088; G11C 2213/72; G11C 5/147; G11C 7/062; G11C 7/14; G11C 8/08; G05F 1/468; G05F 1/575; G05F 3/16; G08B 3/10; G10H 1/26; G10H 2230/351
USPC ........... 365/163; 369/58, 44.25, 94, 124, 112, 369/47, 44.37
See application file for complete search history.

(56) References Cited

U.S. PATENT DOCUMENTS 7,505,330 B2    3/2009  Pawlowski
2008/0068878 A1 3/2008  Nirschl et al.
(Continued)

FOREIGN PATENT DOCUMENTS

CN    101145392 A    3/2008
CN    101599301 A    12/2009
(Continued)

OTHER PUBLICATIONS

Partial English Translation and Abstract of Chinese Patent Application No. CN103594112A, Nov. 20, 2014, 3 pages.
(Continued)

*Primary Examiner* — Dionne H Pendleton
(74) *Attorney, Agent, or Firm* — Conley Rose P.C.; Grant Rodolph; Nicholas K. Beaulieu

(57) ABSTRACT

A write operation method for a phase change memory (PCM) is disclosed. The method includes when a PCM performs a write operation, generating a corresponding voltage pulse signal according to to-be-written data, and applying the voltage pulse signal to a phase change material included in a phase change storage unit corresponding to the to-be-written data and applying the voltage pulse signal to a voltage divider resistor serially connected to the phase change material; comparing voltage values at both ends of a sampling resistor with a threshold voltage to generate an indicator value; determining, according to the indicator value, whether data that is stored in the phase change storage unit and is corresponding to the indicator value is the same as the to-be-written data; and skipping writing if the same; or writing if different, thus reducing the delay time of writing data into the phase change storage unit.

16 Claims, 7 Drawing Sheets

(51) Int. Cl.
  *G11C 13/00* (2006.01)
  *G11B 7/004* (2006.01)
  *G11B 11/105* (2006.01)

(52) U.S. Cl.
  CPC ........ *G11B11/10597* (2013.01); *G11C 13/003* (2013.01); *G11C 13/0004* (2013.01); *G11C 13/0064* (2013.01); *G11C 2013/0066* (2013.01)

(56) References Cited

U.S. PATENT DOCUMENTS

| | | | |
|---|---|---|---|
| 2010/0067289 A1 | 3/2010 | Fuji | |
| 2010/0103726 A1 | 4/2010 | Bae et al. | |
| 2011/0235403 A1 | 9/2011 | Kang | |
| 2011/0261616 A1* | 10/2011 | Kim | G11C 13/0004 365/163 |
| 2013/0028014 A1* | 1/2013 | Guo | G11C 7/062 365/163 |
| 2013/0250657 A1 | 9/2013 | Haukness et al. | |

FOREIGN PATENT DOCUMENTS

| | | |
|---|---|---|
| CN | 102270498 A | 12/2011 |
| CN | 102270505 A | 12/2011 |
| CN | 103165179 A | 6/2013 |
| CN | 103594112 A | 2/2014 |

OTHER PUBLICATIONS

Partial English Translation and Abstract of Chinese Patent Application No. CN102270498A, Jan. 22, 2015, 5 pages.
Foreign Communication From a Counterpart Application, PCT Application No. PCT/CN2014/076532, International Search Report dated Aug. 5, 2014, 7 pages.
Foreign Communication From a Counterpart Application, PCT Application No. PCT/CN2014/076532, Written Opinion dated Aug. 5, 2014, 6 pages.
Yang, B., et al., "A Low Power Phase-Change Random Access Memory using a Data Comparison Write Scheme," International Symposium on Circuits and Systems, May 30, 2007, pp. 3014-3017.
Foreign Communication From a Counterpart Application, European Application No. 14786779.0, Extended European Search Report dated May 8, 2015, 8 pages.
Foreign Communication From A Counterpart Application, Chinese Application No. 201310534736.2, Chinese Office Action dated Nov. 30, 2015, 9 pages.

* cited by examiner

WRITE OPERATION METHOD AND DEVICE FOR PHASE CHANGE MEMORY

CROSS-REFERENCE TO RELATED APPLICATIONS

This application is a continuation of International Application No. PCT/CN2014/076532, filed on Apr. 29, 2014, which claims priority to Chinese Patent Application No. 201310534736.2, filed on Oct. 31, 2013, both of which are hereby incorporated by reference in their entireties.

TECHNICAL FIELD

The present invention relates to the computer field, and in particular, to a write operation method and device for a phase change memory.

BACKGROUND

As a new type of semiconductor memory, a phase change memory features high integration, low power consumption, a high speed, high wear resistance, non-volatility, and the like. The phase change memory is expected to become a next generation storage device since flash. Therefore, a write operation method for the phase change memory has drawn extensive attention.

At present, a write operation method for a phase change memory is provided and is storing to-be-written data in a latch included in a phase change memory; reading corresponding data from the phase change memory according to an address corresponding to the to-be-written data, and comparing the read data with the to-be-written data; if the two are different, writing, into the phase change memory according to the address corresponding to the to-be-written data, the to-be-written data that is stored in the latch; and if the two are the same, skipping writing the to-be-written data into the phase change memory.

In a process of implementing the present invention, the inventor finds that the prior art has at least the following problems.

Before the to-be-written data is written into the phase change memory, it needs to read the corresponding data from the phase change memory and compare the to-be-written data with the read data; and only when the to-be-written data is different from the read data, the to-be-written data is written into the phase change memory. Operations of reading the data and comparing the data are relatively complex and consume a relatively long time, thereby causing that delay time of writing the data into the phase change memory is relatively long, and reducing efficiency of a write operation.

SUMMARY

To solve the problem in the prior art, embodiments of the present invention provide a write operation method and device for a phase change memory. The technical solutions are as follows.

According to a first aspect, a write operation method for a phase change memory is provided, where the method includes when a phase change memory performs a write operation, generating a corresponding voltage pulse signal according to to-be-written data, and applying the voltage pulse signal to a phase change material included in a phase change storage unit corresponding to the to-be-written data and applying the voltage pulse signal to a voltage divider resistor serially connected to the phase change material; comparing voltage values at both ends of a sampling resistor with a threshold voltage to generate an indicator value, where the indicator value is corresponding to data stored in the phase change storage unit, and the sampling resistor is the voltage divider resistor or the phase change material; determining, according to the indicator value, whether the data that is stored in the phase change storage unit and is corresponding to the indicator value is the same as the to-be-written data; and skipping writing the to-be-written data into the phase change storage unit corresponding to the to-be-written data, if the same; or writing the to-be-written data into the phase change storage unit corresponding to the to-be-written data, if different.

With reference to the first aspect, in a first possible implementation manner of the first aspect, the generating a corresponding voltage pulse signal according to to-be-written data, and applying the voltage pulse signal to a phase change material included in a phase change storage unit corresponding to the to-be-written data and applying the voltage pulse signal to a voltage divider resistor serially connected to the phase change material includes writing the to-be-written data into a latch included in the phase change memory; gating, according to a row address and a column address of the to-be-written data, the phase change storage unit corresponding to the to-be-written data; generating the corresponding voltage pulse signal according to the to-be-written data that is stored in the latch; and generating a valid enable signal, so as to apply the voltage pulse signal to the phase change material included in the gated phase change storage unit and apply the voltage pulse signal to the voltage divider resistor serially connected to the phase change material.

With reference to the first aspect or the first possible implementation manner of the first aspect, in a second possible implementation manner of the first aspect, when an output end of a read/write circuit is connected to one end of the voltage divider resistor, the other end of the voltage divider resistor is connected to one end of the phase change material, and the other end of the phase change material is connected to the ground by using a switching tube included in the phase change storage unit; and the comparing voltage values at both ends of a sampling resistor with a threshold voltage to generate an indicator value includes comparing voltage values at both ends of the phase change material with the threshold voltage to generate an indicator value.

With reference to the second possible implementation manner of the first aspect, in a third possible implementation manner of the first aspect, the threshold voltage is a demarcation voltage between two voltages separately presented by the phase change material when the data stored in the phase change storage unit is 0 or 1; when the data stored in the phase change storage unit is 0, the indicator value is a first value, and when the data stored in the phase change storage unit is 1, the indicator value is a second value; and the determining, according to the indicator value, whether the data that is stored in the phase change storage unit and is corresponding to the indicator value is the same as the to-be-written data includes determining, according to that the indicator value is the first value or the second value, whether the data that is stored in the phase change storage unit and is corresponding to the indicator value is the same as the to-be-written data.

With reference to the first aspect or the first possible implementation manner of the first aspect, in a fourth possible implementation manner of the first aspect, when an output end of a read/write circuit is connected to one end of the phase change material, the other end of the phase change material is connected to one end of the voltage divider resistor by using a switching tube included in the phase change storage unit, and the other end of the voltage divider resistor is connected to the ground; and the comparing voltage values at both ends of a sampling resistor with a threshold voltage to generate an indicator value includes comparing voltage values at both ends of the voltage divider resistor with the threshold voltage to generate an indicator value.

With reference to the fourth possible implementation manner of the first aspect, in a fifth possible implementation manner of the first aspect, the threshold voltage is a demarcation voltage between two voltages separately presented by the voltage divider resistor when the data stored in the phase change storage unit is 0 or 1; when the data stored in the phase change storage unit is 0, the indicator value is a third value, and when the data stored in the phase change storage unit is 1, the indicator value is a fourth value; and the determining, according to the indicator value, whether the data that is stored in the phase change storage unit and is corresponding to the indicator value is the same as the to-be-written data includes determining, according to that the indicator value is the third value or the fourth value, whether the data that is stored in the phase change storage unit and is corresponding to the indicator value is the same as the to-be-written data.

With reference to the first possible implementation manner of the first aspect, in a sixth possible implementation manner of the first aspect, the skipping writing the to-be-written data into the phase change storage unit corresponding to the to-be-written data, if the same; or writing the to-be-written data into the phase change storage unit corresponding to the to-be-written data, if different includes if the same, setting the enable signal to invalid, so as to stop applying the voltage pulse signal to the phase change material included in the phase change storage unit corresponding to the to-be-written data and stop applying the voltage pulse signal to the voltage divider resistor serially connected to the phase change material; if different, continuing to apply the voltage pulse signal to the phase change material included in the phase change storage unit corresponding to the to-be-written data and apply the voltage pulse signal to the voltage divider resistor serially connected to the phase change material, so as to change a status of the phase change material included in the phase change storage unit; and when the status of the phase change material included in the phase change storage unit changes, writing the to-be-written data into the phase change storage unit corresponding to the to-be-written data.

According to a second aspect, a write operation device for a phase change memory is provided, where the device includes a generating circuit configured to, when a phase change memory performs a write operation, generate a corresponding voltage pulse signal according to to-be-written data, and apply the voltage pulse signal to a phase change material included in a phase change storage unit corresponding to the to-be-written data and apply the voltage pulse signal to a voltage divider resistor serially connected to the phase change material; a comparator configured to compare voltage values at both ends of a sampling resistor with a threshold voltage to generate an indicator value, where the indicator value is corresponding to data stored in the phase change storage unit, and the sampling resistor is the voltage divider resistor or the phase change material; a first control circuit configured to determine, according to the indicator value, whether the data that is stored in the phase change storage unit and is corresponding to the indicator value is the same as the to-be-written data; and a first write circuit configured to skip writing the to-be-written data into the phase change storage unit corresponding to the to-be-written data, if the same; or write the to-be-written data into the phase change storage unit corresponding to the to-be-written data, if different.

With reference to the second aspect, in a first possible implementation manner of the second aspect, the generating circuit includes a second write circuit configured to write the to-be-written data into a latch included in the phase change memory; a gating circuit configured to gate, according to a row address and a column address of the to-be-written data, the phase change storage unit corresponding to the to-be-written data; a read/write circuit configured to generate the corresponding voltage pulse signal according to the to-be-written data that is stored in the latch; and a second control circuit configured to generate a valid enable signal, so as to apply the voltage pulse signal to the phase change material included in the gated phase change storage unit and apply the voltage pulse signal to the voltage divider resistor serially connected to the phase change material.

With reference to the second aspect or the first possible implementation manner of the second aspect, in a second possible implementation manner of the second aspect, when an output end of the read/write circuit is connected to one end of the voltage divider resistor, the other end of the voltage divider resistor is connected to one end of the phase change material, and the other end of the phase change material is connected to the ground by using a switching tube included in the phase change storage unit; and the comparator is configured to compare voltage values at both ends of the phase change material with the threshold voltage to generate an indicator value.

With reference to the second possible implementation manner of the second aspect, in a third possible implementation manner of the second aspect, the threshold voltage is a demarcation voltage between two voltages separately presented by the phase change material when the data stored in the phase change storage unit is 0 or 1; when the data stored in the phase change storage unit is 0, the indicator value is a first value, and when the data stored in the phase change storage unit is 1, the indicator value is a second value; and the first control circuit is configured to determine, according to that the indicator value is the first value or the second value, whether the data that is stored in the phase change storage unit and is corresponding to the indicator value is the same as the to-be-written data.

With reference to the second aspect or the first possible implementation manner of the second aspect, in a fourth possible implementation manner of the second aspect, when an output end of a read/write circuit is connected to one end of the phase change material, the other end of the phase change material is connected to one end of the voltage divider resistor by using a switching tube included in the phase change storage unit, and the other end of the voltage divider resistor is connected to the ground; and the comparator is configured to compare voltage values at both ends of the voltage divider resistor with the threshold voltage to generate an indicator value.

With reference to the fourth possible implementation manner of the second aspect, in a fifth possible implementation manner of the second aspect, the threshold voltage is a demarcation voltage between two voltages separately presented by the voltage divider resistor when the data stored in the phase change storage unit is 0 or 1; when the data stored in the phase change storage unit is 0, the indicator value is a third value, and when the data stored in the phase change storage unit is 1, the indicator value is a fourth value; and the first control circuit is configured to determine, according to that the indicator value is the third value or the fourth value, whether the data that is stored in the phase change storage unit and is corresponding to the indicator value is the same as the to-be-written data.

With reference to the first possible implementation manner of the second aspect, in a sixth possible implementation manner of the second aspect, the first write circuit includes a third control circuit configured to, if the same, set the enable signal to invalid, so as to stop applying the voltage pulse signal to the phase change material included in the phase change storage unit corresponding to the to-be-written data and stop applying the voltage pulse signal to the voltage divider resistor serially connected to the phase change material; a fourth control circuit configured to, if different, continue to apply the voltage pulse signal to the phase change material included in the phase change storage unit corresponding to the to-be-written data and apply the voltage pulse signal to the voltage divider resistor serially connected to the phase change material, so as to change a status of the phase change material included in the phase change storage unit; and a third write circuit configured to, when the status of the phase change material included in the phase change storage unit changes, write the to-be-written data into the phase change storage unit corresponding to the to-be-written data.

According to a third aspect, a write operation device for a phase change memory is provided, where the device includes a memory and a processor, which are configured to perform the write operation method for a phase change memory.

In embodiments of the present invention, a read/write circuit applies a generated voltage pulse signal to a phase change material included in a phase change storage unit corresponding to to-be-written data and applies the voltage pulse signal to a voltage divider resistor serially connected to the phase change material; voltage values at both ends of the phase change material or voltage values at both ends of the voltage divider resistor are compared with a threshold voltage to generate an indicator value; and it is determined, according to the indicator value, whether data that is stored in the phase change storage unit and is corresponding to the indicator value is the same as the to-be-written data, if the same, the to-be-written data is not written into the phase change storage unit, and otherwise, the to-be-written data is written into the phase change storage unit. Compared with a process of reading data from a phase change storage unit, an operation of comparing voltage values at both ends of a phase change material or voltage values at both ends of a voltage divider resistor with a threshold voltage to generate an indicator value is simpler and consumes shorter time, thereby reducing delay time of writing data into the phase change storage unit, and improving efficiency of a write operation.

BRIEF DESCRIPTION OF THE DRAWINGS

To describe the technical solutions in the embodiments of the present invention more clearly, the following briefly introduces the accompanying drawings required for describing the embodiments. The accompanying drawings in the following description show merely some embodiments of the present invention, and a person of ordinary skill in the art may still derive other drawings from these accompanying drawings without creative efforts.

DETAILED DESCRIPTION

To make the objectives, technical solutions, and advantages of the present invention clearer, the following further describes the embodiments of the present invention in detail with reference to the accompanying drawings.

Embodiment 1

Figure 1:
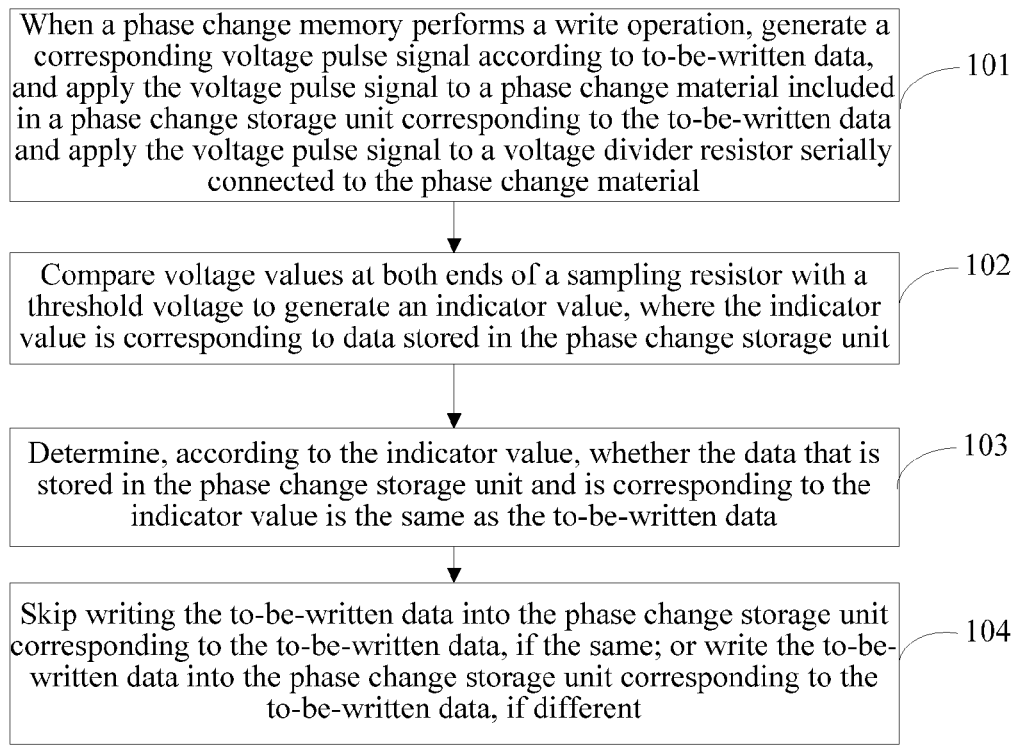
FIG. 1 is a flowchart of a write operation method for a phase change memory according to Embodiment 1 of the present invention.

This embodiment of the present invention provides a write operation method for a phase change memory. Referring to FIG. 1, the method includes:

Step 101: When a phase change memory performs a write operation, generate a corresponding voltage pulse signal according to to-be-written data, and apply the voltage pulse signal to a phase change material included in a phase change storage unit corresponding to the to-be-written data and apply the voltage pulse signal to a voltage divider resistor serially connected to the phase change material.

Step 102: Compare voltage values at both ends of a sampling resistor with a threshold voltage to generate an indicator value, where the indicator value is corresponding to data stored in the phase change storage unit, and the sampling resistor is the voltage divider resistor or the phase change material.

Step 103: Determine, according to the indicator value, whether the data that is stored in the phase change storage unit and is corresponding to the indicator value is the same as the to-be-written data.

Step 104: Skip writing the to-be-written data into the phase change storage unit corresponding to the to-be-written data, if the same; or write the to-be-written data into the phase change storage unit corresponding to the to-be-written data, if different.

The generating a corresponding voltage pulse signal according to to-be-written data, and applying the voltage pulse signal to a phase change material included in a phase change storage unit corresponding to the to-be-written data and applying the voltage pulse signal to a voltage divider resistor serially connected to the phase change material includes writing the to-be-written data into a latch included in the phase change memory; gating, according to a row address and a column address of the to-be-written data, the phase change storage unit corresponding to the to-be-written data; generating the corresponding voltage pulse signal according to the to-be-written data that is stored in the latch; and generating a valid enable signal, so as to apply the voltage pulse signal to the phase change material included in the gated phase change storage unit and apply the voltage pulse signal to the voltage divider resistor serially connected to the phase change material.

When an output end of a read/write circuit is connected to one end of the voltage divider resistor, the other end of the voltage divider resistor is connected to one end of the phase change material, and the other end of the phase change material is connected to the ground by using a switching tube included in the phase change storage unit; and the comparing voltage values at both ends of a sampling resistor with a threshold voltage to generate an indicator value includes comparing voltage values at both ends of the phase change material with the threshold voltage to generate an indicator value.

The threshold voltage is a demarcation voltage between two voltages separately presented by the phase change material when the data stored in the phase change storage unit is 0 or 1; when the data stored in the phase change storage unit is 0, the indicator value is a first value, and when the data stored in the phase change storage unit is 1, the indicator value is a second value; and the determining, according to the indicator value, whether the data that is stored in the phase change storage unit and is corresponding to the indicator value is the same as the to-be-written data includes determining, according to that the indicator value is the first value or the second value, whether the data that is stored in the phase change storage unit and is corresponding to the indicator value is the same as the to-be-written data.

When an output end of a read/write circuit is connected to one end of the phase change material, the other end of the phase change material is connected to one end of the voltage divider resistor by using a switching tube included in the phase change storage unit, and the other end of the voltage divider resistor is connected to the ground; and the comparing voltage values at both ends of a sampling resistor with a threshold voltage to generate an indicator value includes comparing voltage values at both ends of the voltage divider resistor with the threshold voltage to generate an indicator value.

The threshold voltage is a demarcation voltage between two voltages separately presented by the voltage divider resistor when the data stored in the phase change storage unit is 0 or 1; when the data stored in the phase change storage unit is 0, the indicator value is a third value, and when the data stored in the phase change storage unit is 1, the indicator value is a fourth value; and the determining, according to the indicator value, whether the data that is stored in the phase change storage unit and is corresponding to the indicator value is the same as the to-be-written data includes determining, according to that the indicator value is the third value or the fourth value, whether the data that is stored in the phase change storage unit and is corresponding to the indicator value is the same as the to-be-written data.

The skipping writing the to-be-written data into the phase change storage unit corresponding to the to-be-written data, if the same; or writing the to-be-written data into the phase change storage unit corresponding to the to-be-written data, if different includes if the same, setting the enable signal to invalid, so as to stop applying the voltage pulse signal to the phase change material included in the phase change storage unit corresponding to the to-be-written data and stop applying the voltage pulse signal to the voltage divider resistor serially connected to the phase change material; if different, continuing to apply the voltage pulse signal to the phase change material included in the phase change storage unit corresponding to the to-be-written data and apply the voltage pulse signal to the voltage divider resistor serially connected to the phase change material, so as to change a status of the phase change material included in the phase change storage unit; and when the status of the phase change material included in the phase change storage unit changes, writing the to-be-written data into the phase change storage unit corresponding to the to-be-written data.

In this embodiment of the present invention, a read/write circuit applies a generated voltage pulse signal to a phase change material included in a phase change storage unit corresponding to to-be-written data and applies the voltage pulse signal to a voltage divider resistor serially connected to the phase change material; voltage values at both ends of the phase change material or voltage values at both ends of the voltage divider resistor are compared with a threshold voltage to generate an indicator value; and it is determined, according to the indicator value, whether data that is stored in the phase change storage unit and is corresponding to the indicator value is the same as the to-be-written data, if the same, the to-be-written data is not written into the phase change storage unit, and otherwise, the to-be-written data is written into the phase change storage unit. Compared with a process of reading data from a phase change storage unit, an operation of comparing voltage values at both ends of a phase change material or voltage values at both ends of a voltage divider resistor with a threshold voltage to generate an indicator value is simpler and consumes shorter time, thereby reducing delay time of writing data into the phase change storage unit, and improving efficiency of a write operation.

Embodiment 2

Figure 2:
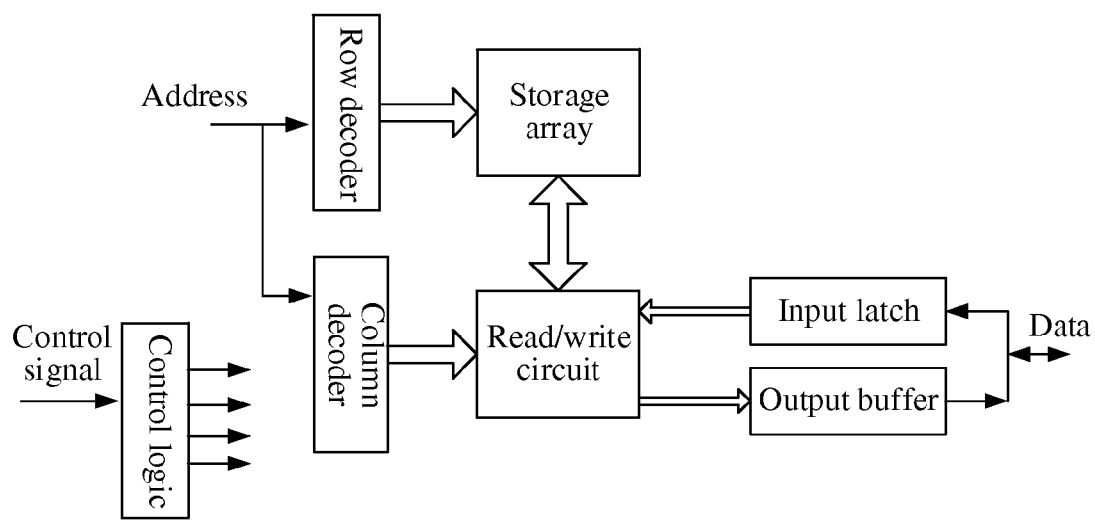
FIG. 2 is a circuit block diagram of a phase change memory according to Embodiment 2 of the present invention.

This embodiment of the present invention provides a write operation method for a phase change memory. Referring to a circuit block diagram of a phase change memory shown in FIG. 2, the phase change memory includes control logic, a row decoder, a column decoder, a storage array, a read/write circuit, an input latch, and an output buffer. A row address is input into the row decoder, and a column address is input into the column decoder. The row decoder decodes the row address and inputs a signal obtained after the decoding into the storage array, so as to gate a certain row in the storage array. The column decoder decodes the column address and inputs a signal obtained after the decoding into the storage array, so as to gate a certain column in the storage array.

Figure 3:
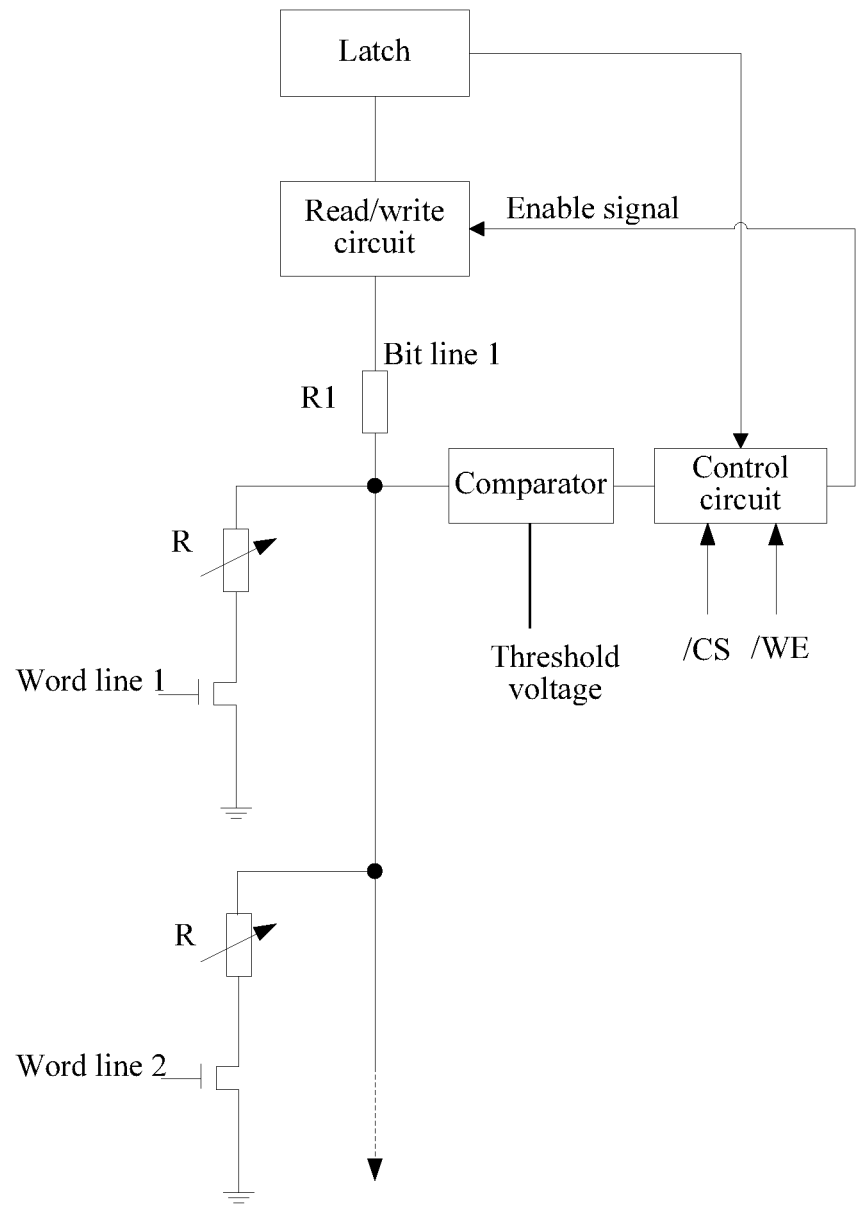
FIG. 3 is a schematic structural diagram of a storage array according to Embodiment 2 of the present invention.

The storage array includes multiple phase change storage units, and the multiple phase change storage units are formed by arranging a word line and a bit line in a cross manner. As shown in FIG. 3, the word line is used to gate multiple phase change storage units in a row in the storage array, the bit line is connected to the read/write circuit, and a voltage pulse signal generated by the read/write circuit may be transferred by using the bit line. A comparator, a control circuit, and a voltage divider resistor R1 are shared by all phase change storage units on a same bit line. Because resistance of a phase change material changes between a high-resistance state and a low-resistance state as a status of the phase change material changes, generally the phase change material is considered as a variable resistor. Each phase change storage unit shown in FIG. 3 has a variable resistor, and the variable resistor is a phase change material of the phase change storage unit. In addition, in FIG. 3, an output end of the read/write circuit is connected to one end of the voltage divider resistor, the other end of the voltage divider resistor is connected to one end of the phase change material, and the other end of the phase change material is connected to the ground by using a switching tube included in the phase change storage unit. In this case, a sampling resistor is a phase change material included in the phase change storage unit.

Figure 4:
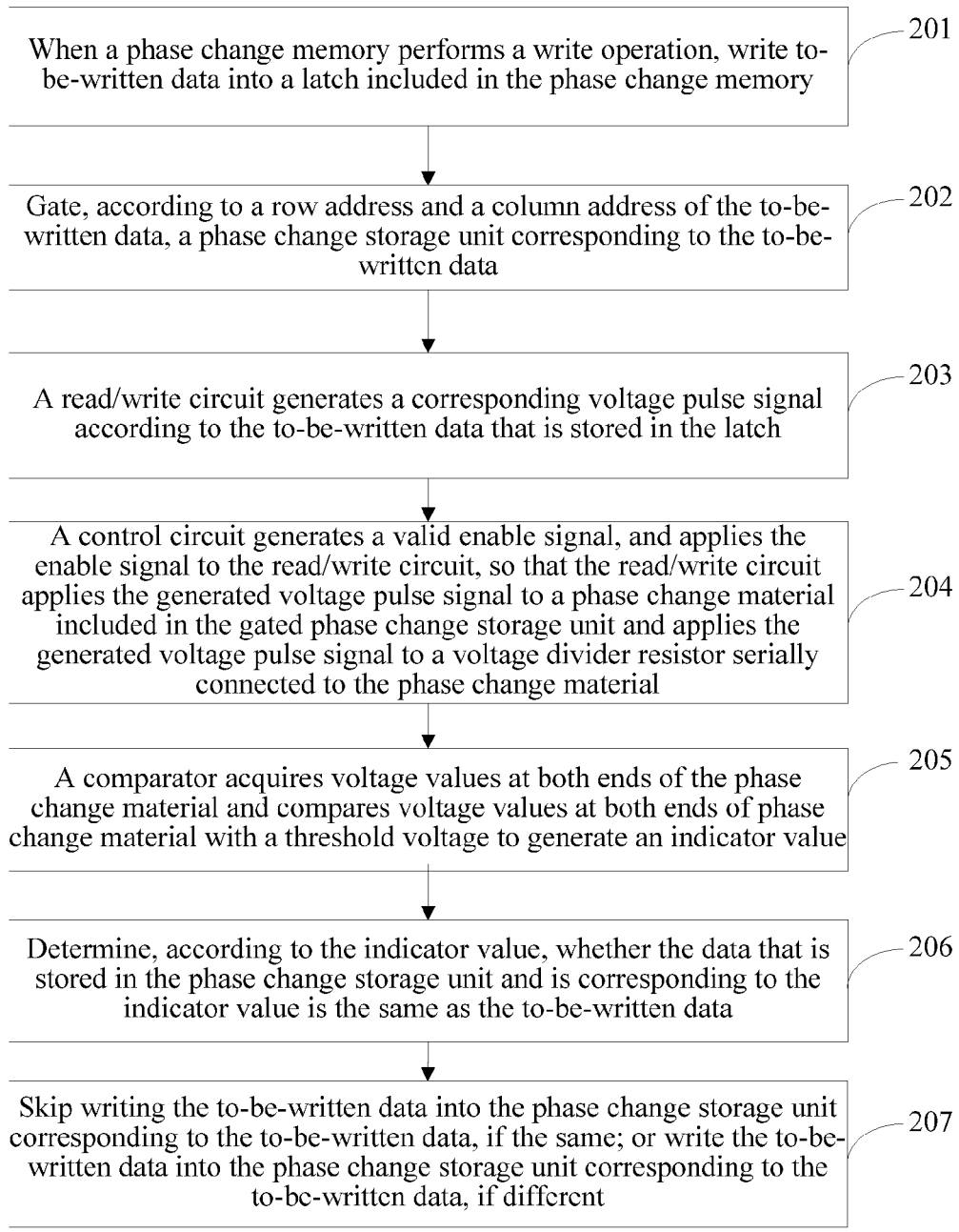
FIG. 4 is a flowchart of a write operation method for a phase change memory according to Embodiment 2 of the present invention.

Referring to FIG. 4, the method includes:

Step 201: When a phase change memory performs a write operation, write to-be-written data into a latch included in the phase change memory.

When the phase change memory performs the write operation, a chip select signal and a write signal of the phase change memory are set to valid.

Generally, a write cycle exists when the write operation is performed on the phase change memory. When it needs to write data into the phase change memory in each write cycle, the phase change memory first stores to-be-written data in the latch included in the phase change memory; and the latch stores only data to be written in a current cycle, that is, when it needs to write data into the phase change memory in the current cycle, the data stored in the latch included in the phase change memory is replaced with the data to be written in the current cycle.

In FIG. 3, the chip select signal is indicated by /CS, and the write signal is indicated by /WE.

Step 202: Gate, according to a row address and a column address of the to-be-written data, a phase change storage unit corresponding to the to-be-written data.

Specifically, the row address of the to-be-written data is input into the row decoder of the phase change memory, the input row address is decoded by using the row decoder, and a signal obtained after the decoding is input into a word line corresponding to the storage array, so as to gate a corresponding row of phase change storage units in the storage array; and the column address of the to-be-written data is input into the column decoder of the phase change memory, the input column address is decoded by using the column decoder, and a signal obtained after the decoding is input into a bit line corresponding to the storage array, so as to gate one phase change storage unit in a corresponding column of phase change storage units in the storage array. Because the bit line and the word line are arranged in a cross manner, the phase change storage unit corresponding to the to-be-written data can be gated according to a selected word line and bit line.

The signal obtained after the row address is decoded by using the row decoder is input into the word line corresponding to the storage array, so that a switching tube included in the phase change storage unit can be turned on.

When the word line is of a high level, the switching tube is turned on; and when the word line is of a low level, the switching tube is turned off. The switching tube may be a transistor, a metal-oxide-silicon (MOS) transistor, or a diode. The MOS transistor is used as an example in FIG. 3. A type of the switching tube is not limited in this embodiment of the present invention.

Step 203: A read/write circuit generates a corresponding voltage pulse signal according to the to-be-written data that is stored in the latch.

The phase change memory stores information by using different statuses of the phase change material, and the phase change material has two stable statuses: a crystalline state and an amorphous state. When the phase change material is in the crystalline state, resistance of the phase change material is relatively low, that is, a low-resistance state. For example, the resistance of the phase change material is 1-10 KiloOhm (KΩ), and in this case, digital logic 0 can be stored in a phase change storage unit corresponding to the phase change material. When the phase change material is in the amorphous state, the resistance of the phase change material is relatively high, that is, a high-resistance state. For example, the resistance of the phase change material is 1 MegaOhm (MΩ), and in this case, digital logic 1 can be stored in the phase change storage unit corresponding to the phase change material.

Write pulses of the phase change memory include a RESET pulse and a SET pulse. The RESET pulse is used to change the status of the phase change material from the crystalline state to the amorphous state, and the SET pulse is used to change the status of the phase change material from the amorphous state to the crystalline state. Therefore, that the read/write circuit generates a corresponding voltage pulse signal according to the to-be-written data that is stored in the latch includes that if the to-be-written data that is stored in the latch is digital logic 1, it is determined that a status of the phase change material included in the phase change storage unit must be changed to the amorphous state, and the read/write circuit generates a RESET pulse; and if the to-be-written data that is stored in the latch is digital logic 0, it is determined that the status of the phase change material included in the phase change storage unit must be changed to the crystalline state, and the read/write circuit generates a SET pulse.

A waveform amplitude of the RESET pulse is relatively high, for example, 2 volts (V), and a temperature generated by the RESET pulse exceeds a melting temperature of the phase change material, which lasts for an extremely short time, and generally is dozens of nanoseconds. An amplitude of the SET pulse is relatively low, for example, 1 V, and a temperature generated by the SET pulse exceeds a crystallization temperature of the phase change material, which lasts for a relatively long time, and generally is more than 100 nanoseconds, but is lower than the melting temperature.

In this embodiment of the present invention, the status of the phase change material is changed from the crystalline state to the amorphous state by using the RESET pulse, and the status of the phase change material is changed from the amorphous state to the crystalline state by using the SET pulse. However, in a practical application, a type of a pulse for changing the status of the phase change material is not limited, only if a temperature generated by a pulse for changing the status of the phase change material from the crystalline state to the amorphous state exceeds the melting temperature of the phase change material, and a temperature generated by a pulse for changing the status of the phase change material from the amorphous state to the crystalline state exceeds the crystallization temperature of the phase change material and is lower than the melting temperature of the phase change material.

Step 204: A control circuit generates a valid enable signal, and applies the enable signal to the read/write circuit, so that the read/write circuit applies the generated voltage pulse signal to a phase change material included in the gated phase change storage unit and applies the generated voltage pulse signal to a voltage divider resistor serially connected to the phase change material.

Because the chip select signal and the write signal of the phase change memory are applied to the control circuit in the storage array, when the chip select signal and the write signal of the phase change memory are valid, the control circuit is triggered to generate the valid enable signal and apply the enable signal to the read/write circuit, so that the read/write circuit applies the generated voltage pulse signal to the phase change material included in the gated phase change storage unit and applies the generated voltage pulse signal to the voltage divider resistor serially connected to the phase change material.

In this embodiment of the present invention, the control circuit may be a state machine. The control circuit is not limited in this embodiment of the present invention.

In this embodiment of the present invention, whether the read/write circuit applies the generated voltage pulse signal to the phase change material included in the gated phase change storage unit and applies the generated voltage pulse signal to the voltage divider resistor serially connected to the phase change material is controlled by using the enable signal generated by the control circuit. When the enable signal generated by the control circuit is valid, the read/write circuit is controlled to apply the generated voltage pulse signal to the phase change material included in the gated phase change storage unit and apply the generated voltage pulse signal to the voltage divider resistor serially connected to the phase change material. When the enable signal generated by the control circuit is invalid, the read/write circuit is controlled to stop applying the generated voltage pulse signal to the phase change material included in the gated phase change storage unit and stop applying the generated voltage pulse signal to the voltage divider resistor serially connected to the phase change material.

Step 205: A comparator acquires voltage values at both ends of the phase change material and compares the voltage values at both ends of the phase change material with a threshold voltage to generate an indicator value, where the indicator value is corresponding to data stored in the phase change storage unit.

Specifically, this step may be implemented by performing the following steps (1) to (3), which include:

(1) The comparator acquires voltage values at both ends of the phase change material and compares the voltage values at both ends of the phase change material with a threshold voltage.

The phase change storage unit includes the phase change material, and the voltage divider resistor is serially connected to the phase change storage material. The voltage pulse signal generated by the read/write circuit is applied to the phase change material included in the phase change storage unit and is applied to the voltage divider resistor serially connected to the phase change material. Because a voltage value is extremely low when the switching tube included in the phase change storage unit is turned on, a turn-on voltage of the switching tube may be ignored, that is, a sum of voltages at both ends of the phase change material included in the phase change storage unit and voltages at both ends of the voltage divider resistor is equal to an amplitude of the voltage pulse signal generated by the read/write circuit. Therefore, the comparator may detect a voltage value at an intersection point between the voltage divider resistor R1 and the phase change material R included in the phase change storage unit, so as to obtain the voltage values at both ends of the phase change material included in the phase change storage unit.

The threshold voltage is a demarcation voltage between two voltages separately presented by the phase change material when the data stored in the phase change storage unit is 0 or 1; when the data stored in the phase change storage unit is 0, the indicator value is a first value, and when the data stored in the phase change storage unit is 1, the indicator value is a second value.

(2) If the voltage values at both ends of the phase change material are smaller than the threshold voltage, the generated indicator value is a first value.

If the voltage values at both ends of the phase change material are smaller than the threshold voltage, it is determined that the phase change material is in a low-resistance state, that is, the data stored in the phase change storage unit corresponding to the phase change material is 0.

Further, a correspondence between the data 0 stored in the phase change storage unit and the first value is stored.

It is assumed that when the first value is indicated by 0 or 1, and if the voltage signals at both ends of the phase change material are connected to an in-phase input end of the comparator, and a threshold voltage signal is connected to a reverse-phase input end of the comparator, the first value is 0 when the voltage values at both ends of the phase change material are smaller than the threshold voltage; and if the voltage values at both ends of the phase change material are connected to the reverse-phase input end of the comparator, and the threshold voltage is connected to the in-phase input end of the comparator, the first value is 1 when the voltage values at both ends of the phase change material are smaller than the threshold voltage.

(3) If the voltage values at both ends of the phase change material are greater than the threshold voltage, the generated indicator value is a second value.

If the voltage values at both ends of the phase change material are greater than the threshold voltage, it is determined that the phase change material is in a high-resistance state, that is, the data stored in the phase change storage unit corresponding to the phase change material is 1.

Further, a correspondence between the data 1 stored in the phase change storage unit and the second value is stored.

It is assumed that when the second value is indicated by 0 or 1, and if the voltage signals at both ends of the phase change material are connected to an in-phase input end of the comparator, and a threshold voltage signal is connected to a reverse-phase input end of the comparator, the second value is 1 when the voltage values at both ends of the phase change material are greater than the threshold voltage; and if the voltage values at both ends of the phase change material are connected to the reverse-phase input end of the comparator, and the threshold voltage is connected to the in-phase input end of the comparator, the second value is 0 when the voltage values at both ends of the phase change material are greater than the threshold voltage.

Further, after the comparator compares the voltage values at both ends of the phase change material included in the phase change storage unit with the threshold voltage to generate the indicator value, the comparator outputs the indicator value to the control circuit.

The threshold voltage is set by technical personnel in advance according to an amplitude of a voltage pulse signal applied by the read/write circuit to the phase change storage unit and according to a resistance value of the phase change material included in the phase change storage unit and a resistance value of the voltage divider resistor, and the set threshold voltage is not equal to the voltage values at both ends of the phase change material included in the phase change storage unit.

Step 206: Determine, according to the indicator value, whether the data that is stored in the phase change storage unit and is corresponding to the indicator value is the same as the to-be-written data.

Specifically, if the indicator value is the first value, it is determined that the data that is stored in the phase change storage unit and is corresponding to the indicator value is 0, if the to-be-written data is 0, it is determined that the data stored in the phase change storage unit is the same as the to-be-written data, and if the to-be-written data is 1, it is determined that the data stored in the phase change storage unit is different from the to-be-written data. If the indicator value is the second value, it is determined that the data that is stored in the phase change storage unit and is corresponding to the indicator value is 1, if the to-be-written data is 0, it is determined that the data stored in the phase change storage unit is different from the to-be-written data, and if the to-be-written data is 1, it is determined that the data stored in the phase change storage unit is the same as the to-be-written data.

Step 207: Skip writing the to-be-written data into the phase change storage unit corresponding to the to-be-written data, if the same; or write the to-be-written data into the phase change storage unit corresponding to the to-be-written data, if different.

Specifically, if the same, the enable signal generated by the control circuit is set to invalid, so as to stop applying the voltage pulse signal generated by the read/write circuit to the phase change storage unit. If different, the enable signal generated by the control circuit continues to be kept valid, and the voltage pulse signal generated by the read/write circuit continues to be applied to the phase change material included in the phase change storage unit and applied to the voltage divider resistor serially connected to the phase change material, so as to change the status of the phase change material included in the phase change storage unit. When the status of the phase change material included in the phase change storage unit changes, the to-be-written data that is stored in the latch is written into the phase change storage unit.

Changing of the status of the phase change material is implemented by using a heating effect of a current applied to the phase change material, where heat generated by the current is $Q=I^2*R*t$. When the status of the phase change material is changed from the crystalline state to the amorphous state, a temperature applied to the phase change material must reach the melting temperature of the phase change material; and when the status of the phase change material is changed from the amorphous state to the crystalline state, the temperature applied to the phase change material must reach the crystallization temperature of the phase change material. It takes a period of time to heat the temperature of the phase change material to the melting temperature or the crystallization temperature. Therefore, before this period of time, the voltages at both ends of the phase change material are detected; the detected voltages are compared with the threshold voltage to generate the indicator value; it is determined, according to the indicator value and the to-be-written data, whether to open the read/write circuit; and when the read/write circuit is opened, a current write operation is canceled in advance. In this way, no obvious change occurs to the phase change material, thereby avoiding a loss of the phase change material and prolonging a service life of the phase change memory.

In this embodiment of the present invention, a read/write circuit applies a generated voltage pulse signal to a phase change material included in a phase change storage unit corresponding to to-be-written data and applies the voltage pulse signal to a voltage divider resistor; voltage values at both ends of the phase change material are compared with a threshold voltage to generate an indicator value; it is determined, according to the indicator value, whether data that is stored in the phase change storage unit and is corresponding to the indicator value is the same as the to-be-written data, if the same, the to-be-written data is not written into the phase change storage unit, and otherwise, the to-be-written data is written into the phase change storage unit. Compared with a process of reading data from a phase change storage unit, an operation of comparing voltage values at both ends of a phase change material with a threshold voltage to generate an indicator value is simpler and consumes shorter time, thereby reducing delay time of writing data into the phase change storage unit, and improving efficiency of a write operation.

Embodiment 3

Figure 5:
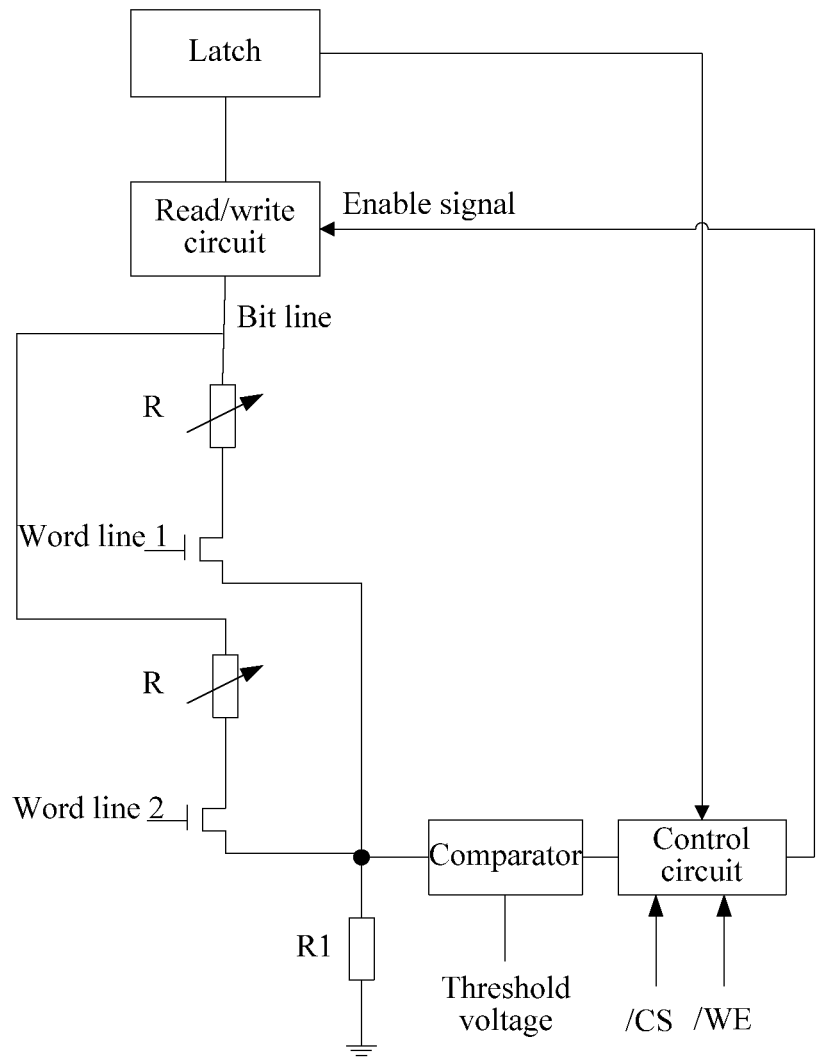
FIG. 5 is a schematic structural diagram of a storage array according to Embodiment 3 of the present invention.

This embodiment of the present invention provides a write operation method for a phase change memory. As shown in FIG. 5, a word line is used to gate multiple phase change storage units in a row in a storage array, a bit line is connected to a read/write circuit, and a voltage pulse signal generated by the read/write circuit may be transferred by using the bit line. A comparator, a control circuit, and a voltage divider resistor R1 are shared by all phase change storage units on a same bit line. Because resistance of a phase change material changes between a high-resistance state and a low-resistance state as a status of the phase change material changes, generally the phase change material is considered as a variable resistor. Each phase change storage unit shown in FIG. 5 has a variable resistor, and the variable resistor is a phase change material of the phase change storage unit. In addition, in FIG. 5, an output end of the read/write circuit is connected to one end of the phase change material, the other end of the phase change material is connected to one end of the voltage divider resistor by using a switching tube included in the phase change storage unit, and the other end of the voltage divider resistor is connected to the ground. In this case, a sampling resistor is the voltage divider resistor.

Figure 6:
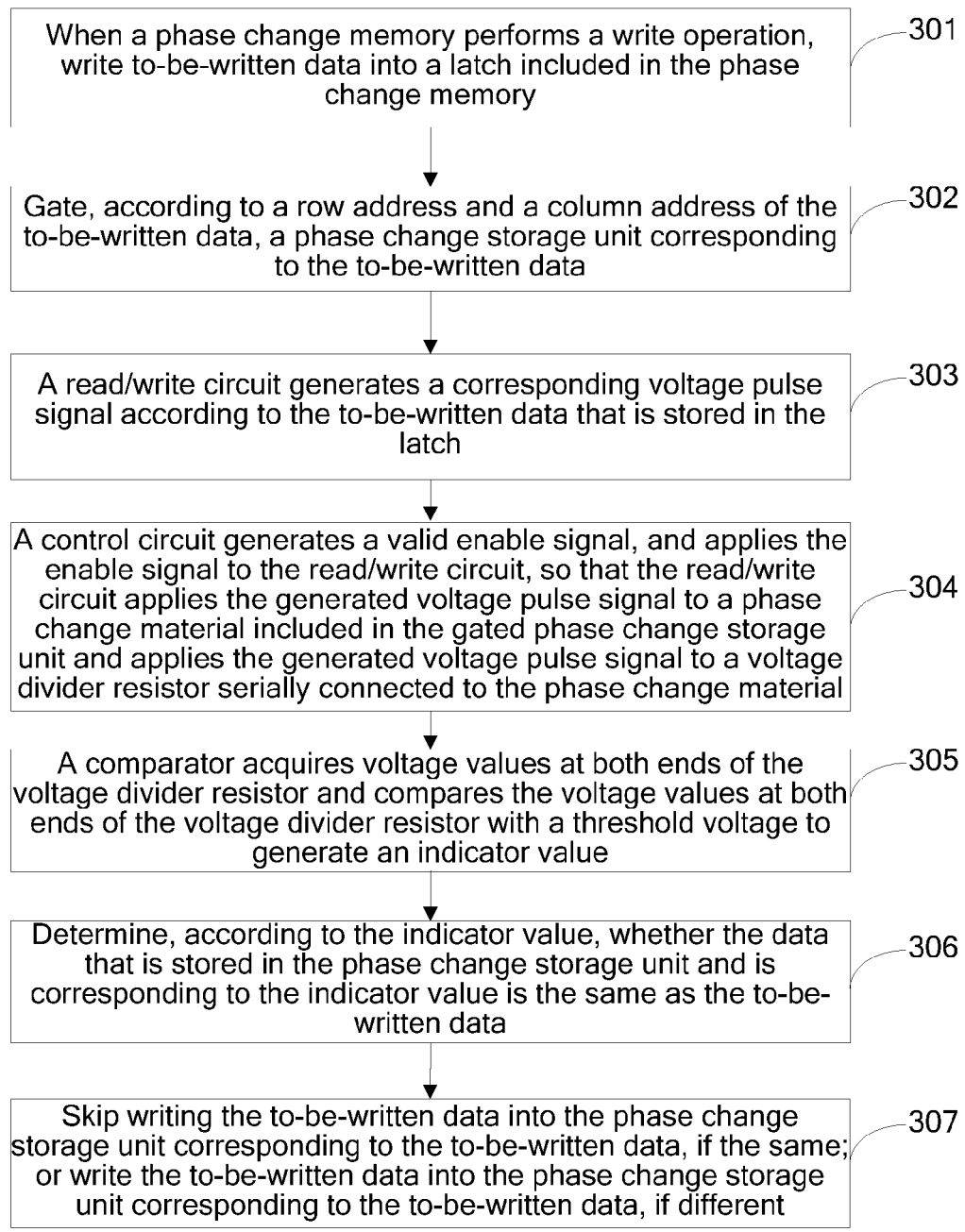
FIG. 6 is a flowchart of a write operation method for a phase change memory according to Embodiment 3 of the present invention.

Referring to FIG. 6, the method includes:

Step 301: When a phase change memory performs a write operation, write to-be-written data into a latch included in the phase change memory.

When the phase change memory performs the write operation, a chip select signal and a write signal of the phase change memory are set to valid.

Generally, a write cycle exists when the write operation is performed on the phase change memory. When it needs to write data into the phase change memory in each write cycle, the phase change memory first stores to-be-written data in the latch included in the phase change memory; and the latch stores only data to be written in a current cycle, that is, when it needs to write data into the phase change memory in the current cycle, the data stored in the latch included in the phase change memory is replaced with the data to be written in the current cycle.

In FIG. 5, the chip select signal is indicated by /CS, and the write signal is indicated by /WE.

Step 302: Gate, according to a row address and a column address of the to-be-written data, a phase change storage unit corresponding to the to-be-written data.

Specifically, the row address of the to-be-written data is input into a row decoder of the phase change memory, the input row address is decoded by using the row decoder, and a signal obtained after the decoding is input into a word line corresponding to the storage array, so as to gate a corresponding row of phase change storage units in the storage array; and the column address of the to-be-written data is input into a column decoder of the phase change memory, the input column address is decoded by using the column decoder, and a signal obtained after the decoding is input into a bit line corresponding to the storage array, so as to gate one phase change storage unit in a corresponding column of phase change storage units in the storage array. Because the bit line and the word line are arranged in a cross manner, the phase change storage unit corresponding to the to-be-written data can be gated according to a selected word line and bit line.

The signal obtained after the row address is decoded by using the row decoder is input into the word line corresponding to the storage array, so that a switching tube included in the phase change storage unit can be turned on.

When the word line is of a high level, the switching tube is turned on; and when the word line is of a low level, the switching tube is turned off. The switching tube may be a transistor, a MOS transistor, or a diode. The MOS transistor is used as an example in FIG. 5. A type of the switching tube is not limited in this embodiment of the present invention.

Step 303: A read/write circuit generates a corresponding voltage pulse signal according to the to-be-written data that is stored in the latch.

The phase change memory stores information by using different statuses of the phase change material, and the phase change material has two stable statuses: a crystalline state and an amorphous state. When the phase change material is in the crystalline state, resistance of the phase change material is relatively low, that is, a low-resistance state. For example, the resistance of the phase change material is 1-10 KΩ, and in this case, digital logic 0 can be stored in a phase change storage unit corresponding to the phase change material. When the phase change material is in the amorphous state, the resistance of the phase change material is relatively high, that is, a high-resistance state. For example, the resistance of the phase change material is 1 MΩ, and in this case, digital logic 1 can be stored in the phase change storage unit corresponding to the phase change material.

Write pulses of the phase change memory include a RESET pulse and a SET pulse. The RESET pulse is used to change the status of the phase change material from the crystalline state to the amorphous state, and the SET pulse is used to change the status of the phase change material from the amorphous state to the crystalline state. Therefore, that the read/write circuit generates a corresponding voltage pulse signal according to the to-be-written data that is stored in the latch includes that if the to-be-written data that is stored in the latch is digital logic 1, it is determined that a status of the phase change material included in the phase change storage unit must be changed to the amorphous state, and the read/write circuit generates a RESET pulse; and if the to-be-written data that is stored in the latch is digital logic 0, it is determined that the status of the phase change material included in the phase change storage unit must be changed to the crystalline state, and the read/write circuit generates a SET pulse.

A waveform amplitude of the RESET pulse is relatively high, for example, 2 V, and a temperature generated by the RESET pulse exceeds a melting temperature of the phase change material, which lasts for an extremely short time, and generally is dozens of nanoseconds. An amplitude of the SET pulse is relatively low, for example, 1 V, and a temperature generated by the SET pulse exceeds a crystallization temperature of the phase change material, which lasts for a relatively long time, and generally is more than 100 nanoseconds, but is lower than the melting temperature.

In this embodiment of the present invention, the status of the phase change material is changed from the crystalline state to the amorphous state by using the RESET pulse, and the status of the phase change material is changed from the amorphous state to the crystalline state by using the SET pulse. However, in a practical application, a type of a pulse for changing the status of the phase change material is not limited, only if a temperature generated by a pulse for changing the status of the phase change material from the crystalline state to the amorphous state exceeds the melting temperature of the phase change material, and a temperature generated by a pulse for changing the status of the phase change material from the amorphous state to the crystalline state exceeds the crystallization temperature of the phase change material and is lower than the melting temperature of the phase change material.

Step 304: A control circuit generates a valid enable signal, and applies the enable signal to the read/write circuit, so that the read/write circuit applies the generated voltage pulse signal to a phase change material included in the gated phase change storage unit and applies the generated voltage pulse signal to a voltage divider resistor serially connected to the phase change material.

Because the chip select signal and the write signal of the phase change memory are applied to the control circuit in the storage array, when the chip select signal and the write signal of the phase change memory are valid, the control circuit is triggered to generate the valid enable signal and apply the enable signal to the read/write circuit, so that the read/write circuit applies the generated voltage pulse signal to the phase change material included in the gated phase change storage unit and applies the generated voltage pulse signal to the voltage divider resistor serially connected to the phase change material.

In this embodiment of the present invention, the control circuit may be a state machine. The control circuit is not limited in this embodiment of the present invention.

In this embodiment of the present invention, whether the read/write circuit applies the generated voltage pulse signal to the phase change material included in the gated phase change storage unit and applies the generated voltage pulse signal to the voltage divider resistor serially connected to the phase change material is controlled by using the enable signal generated by the control circuit. When the enable signal generated by the control circuit is valid, the read/write circuit is controlled to apply the generated voltage pulse signal to the phase change material included in the gated phase change storage unit and apply the generated voltage pulse signal to the voltage divider resistor serially connected to the phase change material. When the enable signal generated by the control circuit is invalid, the read/write circuit is controlled to stop applying the generated voltage pulse signal to the phase change material included in the gated phase change storage unit and stop applying the generated voltage pulse signal to the voltage divider resistor serially connected to the phase change material.

Step 305: A comparator acquires voltage values at both ends of the voltage divider resistor and compares the voltage values at both ends of the voltage divider resistor with a threshold voltage to generate an indicator value, where the indicator value is corresponding to data stored in the phase change storage unit.

Specifically, this step may be implemented by performing the following steps (1) to (3), which include:

(1) The comparator acquires voltage values at both ends of the voltage divider resistor and compares the voltage values at both ends of the voltage divider resistor with a threshold voltage.

The phase change storage unit includes the phase change material, and the voltage divider resistor is serially connected to the phase change storage material. The voltage pulse signal generated by the read/write circuit is applied to the phase change material included in the phase change storage unit and is applied to the voltage divider resistor serially connected to the phase change material. Because a voltage value is extremely low when the switching tube included in the phase change storage unit is turned on, a turn-on voltage of the switching tube may be ignored, that is, a sum of voltages at both ends of the phase change material included in the phase change storage unit and voltages at both ends of the voltage divider resistor is equal to an amplitude of the voltage pulse signal generated by the read/write circuit. Therefore, the comparator may detect a voltage value at an intersection point between the voltage divider resistor R1 and the switching tube included in the phase change storage unit, so as to obtain the voltage values at both ends of the voltage divider resistor.

The threshold voltage is a demarcation voltage between two voltages separately presented by the voltage divider resistor when the data stored in the phase change storage unit is 0 or 1; when the data stored in the phase change storage unit is 0, the indicator value is a third value, and when the data stored in the phase change storage unit is 1, the indicator value is a fourth value.

(2) If the voltage values at both ends of the voltage divider resistor are smaller than the threshold voltage, the generated indicator value is a fourth value.

If the voltage values at both ends of the voltage divider resistor are smaller than the threshold voltage, it is determined that the phase change material is in a high-resistance state, that is, the data stored in the phase change storage unit corresponding to the phase change material is 1.

Further, a correspondence between the data 1 stored in the phase change storage unit and the fourth value is stored.

The fourth value may be the same as a first value. Certainly, the fourth value may also be different from the first value.

It is assumed that when the fourth value is also indicated by 0 or 1, and if the voltage values at both ends of the voltage divider resistor are connected to an in-phase input end of the comparator, and the threshold voltage is connected to a reverse-phase input end of the comparator, the fourth value is 0 when the voltage values at both ends of the voltage divider resistor are smaller than the threshold voltage; and if the voltage values at both ends of the voltage divider resistor are connected to the reverse-phase input end of the comparator, and the threshold voltage is connected to the in-phase input end of the comparator, the fourth value is 1 when the voltage values at both ends of the voltage divider resistor are smaller than the threshold voltage.

(3) If the voltage values at both ends of the voltage divider resistor are greater than the threshold voltage, the generated indicator value is a third value.

If the voltage values at both ends of the voltage divider resistor are greater than the threshold voltage, it is determined that the phase change material is in a low-resistance state, that is, the data stored in the phase change storage unit corresponding to the phase change material is 0.

Further, a correspondence between the data 0 stored in the phase change storage unit and the third value is stored.

The third value may be the same as a second value. Certainly, the third value may also be different from the second value.

It is assumed that when the third value is also indicated by 0 or 1, and if the voltage values at both ends of the voltage divider resistor are connected to an in-phase input end of the comparator, and the threshold voltage is connected to a reverse-phase input end of the comparator, the third value is 1 when the voltage values at both ends of the voltage divider resistor are greater than the threshold voltage; and if the voltage values at both ends of the voltage divider resistor are connected to the reverse-phase input end of the comparator, and the threshold voltage is connected to the in-phase input end of the comparator, the third value is 0 when the voltage values at both ends of the voltage divider resistor are greater than the threshold voltage.

Further, after the comparator compares the voltage values at both ends of the voltage divider resistor with the threshold voltage to generate the indicator value, the comparator outputs the indicator value to the control circuit.

The threshold voltage is set by technical personnel in advance according to an amplitude of a voltage pulse signal applied by the read/write circuit to the phase change storage unit and according to a resistance value of the phase change material included in the phase change storage unit and a resistance value of the voltage divider resistor, and the set threshold voltage is not equal to the voltage values at both ends of the voltage divider resistor.

Step 306: Determine, according to the indicator value, whether the data that is stored in the phase change storage unit and is corresponding to the indicator value is the same as the to-be-written data.

Specifically, if the indicator value is the third value, it is determined that the data that is stored in the phase change storage unit and is corresponding to the indicator value is 0, if the to-be-written data is 0, it is determined that the data stored in the phase change storage unit is the same as the to-be-written data, and if the to-be-written data is 1, it is determined that the data stored in the phase change storage unit is different from the to-be-written data. If the indicator value is the fourth value, it is determined that the data that is stored in the phase change storage unit and is corresponding to the indicator value is 1, if the to-be-written data is 0, it is determined that the data stored in the phase change storage unit is different from the to-be-written data, and if the to-be-written data is 1, it is determined that the data stored in the phase change storage unit is the same as the to-be-written data.

Step 307: Skip writing the to-be-written data into the phase change storage unit corresponding to the to-be-written data, if the same; or write the to-be-written data into the phase change storage unit corresponding to the to-be-written data, if different.

Specifically, if the same, the enable signal generated by the control circuit is set to invalid, so as to stop applying the voltage pulse signal generated by the read/write circuit to the phase change storage unit. If different, the enable signal generated by the control circuit continues to be kept valid, and the voltage pulse signal generated by the read/write circuit continues to be applied to the phase change material included in the phase change storage unit and applied to the voltage divider resistor serially connected to the phase change material, so as to change the status of the phase change material included in the phase change storage unit. When the status of the phase change material included in the phase change storage unit changes, the to-be-written data that is stored in the latch is written into the phase change storage unit.

Changing of the status of the phase change material is implemented by using a heating effect of a current applied to the phase change material, where heat generated by the current is $Q=I^2*R*t$. When the status of the phase change material is changed from the crystalline state to the amorphous state, a temperature applied to the phase change material must reach the melting temperature of the phase change material; and when the status of the phase change material is changed from the amorphous state to the crystalline state, the temperature applied to the phase change material must reach the crystallization temperature of the phase change material. It takes a period of time to heat the temperature of the phase change material to the melting temperature or the crystallization temperature. Therefore, before this period of time, the voltages at both ends of the voltage divider resistor are detected; the detected voltages are compared with the threshold voltage to generate the indicator value; it is determined, according to the indicator value and the to-be-written data, whether to open the read/write circuit; and when the read/write circuit is opened, a current write operation is canceled in advance. In this way, no obvious change occurs to the phase change material, thereby avoiding a loss of the phase change material and prolonging a service life of the phase change memory.

In this embodiment of the present invention, a read/write circuit applies a generated voltage pulse signal to a phase change material included in a phase change storage unit corresponding to to-be-written data and applies the voltage pulse signal to a voltage divider resistor; an indicator value is set according to voltage values at both ends of the voltage divider resistor; and it is determined, according to the indicator value, whether data that is stored in the phase change storage unit and is corresponding to the indicator value is the same as the to-be-written data, if the same, the to-be-written data is not written into the phase change storage unit, and otherwise, the to-be-written data is written into the phase change storage unit. Compared with a process of reading data from a phase change storage unit, an operation of comparing voltage values at both ends of a voltage divider resistor with a threshold voltage to generate an indicator value is simpler and consumes shorter time, thereby reducing delay time of writing data into the phase change storage unit, and improving efficiency of a write operation.

Embodiment 4

Figure 7:
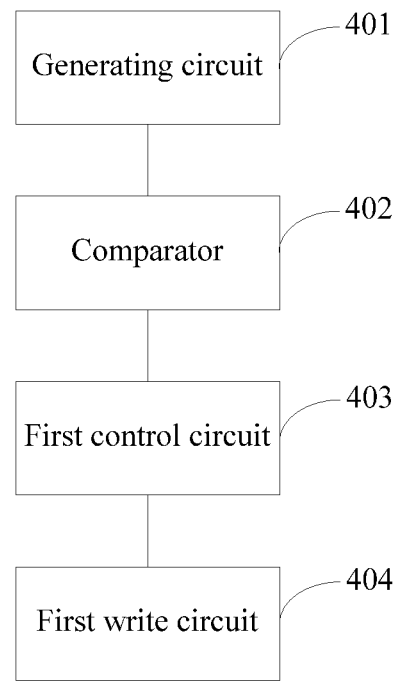
FIG. 7 is a schematic structural diagram of a write operation device for a phase change memory according to Embodiment 4 of the present invention.

Referring to FIG. 7, this embodiment of the present invention provides a write operation device for a phase change memory, where the device includes a generating circuit 401 configured to, when a phase change memory performs a write operation, generate a corresponding voltage pulse signal according to to-be-written data, and apply the voltage pulse signal to a phase change material included in a phase change storage unit corresponding to the to-be-written data and apply the voltage pulse signal to a voltage divider resistor serially connected to the phase change material; a comparator 402 configured to compare voltage values at both ends of a sampling resistor with a threshold voltage to generate an indicator value, where the indicator value is corresponding to data stored in the phase change storage unit, and the sampling resistor is the voltage divider resistor or the phase change material; a first control circuit 403 configured to determine, according to the indicator value, whether the data that is stored in the phase change storage unit and is corresponding to the indicator value is the same as the to-be-written data; and a first write circuit 404 configured to skip writing the to-be-written data into the phase change storage unit corresponding to the to-be-written data, if the same; or write the to-be-written data into the phase change storage unit corresponding to the to-be-written data, if different.

The generating circuit 401 includes a second write circuit configured to write the to-be-written data into a latch included in the phase change memory; a gating circuit configured to gate, according to a row address and a column address of the to-be-written data, the phase change storage unit corresponding to the to-be-written data; a read/write circuit configured to generate the corresponding voltage pulse signal according to the to-be-written data that is stored in the latch; and a second control circuit configured to generate a valid enable signal, so as to apply the voltage pulse signal to the phase change material included in the gated phase change storage unit and apply the voltage pulse signal to the voltage divider resistor serially connected to the phase change material.

When an output end of the read/write circuit is connected to one end of the voltage divider resistor, the other end of the voltage divider resistor is connected to one end of the phase change material, and the other end of the phase change material is connected to the ground by using a switching tube included in the phase change storage unit; and the comparator 402 is configured to compare voltage values at both ends of the phase change material with the threshold voltage to generate an indicator value.

The threshold voltage is a demarcation voltage between two voltages separately presented by the phase change material when the data stored in the phase change storage unit is 0 or 1; when the data stored in the phase change storage unit is 0, the indicator value is a first value, and when the data stored in the phase change storage unit is 1, the indicator value is a second value; and the first control circuit 403 is configured to determine, according to that the indicator value is the first value or the second value, whether the data that is stored in the phase change storage unit and is corresponding to the indicator value is the same as the to-be-written data.

When an output end of the read/write circuit is connected to one end of the phase change material, the other end of the phase change material is connected to one end of the voltage divider resistor by using a switching tube included in the phase change storage unit, and the other end of the voltage divider resistor is connected to the ground; and the comparator 402 is configured to compare voltage values at both ends of the voltage divider resistor with the threshold voltage to generate an indicator value.

The threshold voltage is a demarcation voltage between two voltages separately presented by the voltage divider resistor when the data stored in the phase change storage unit is 0 or 1; when the data stored in the phase change storage unit is 0, the indicator value is a third value, and when the data stored in the phase change storage unit is 1, the indicator value is a fourth value; and the first control circuit 403 is configured to determine, according to that the indicator value is the third value or the fourth value, whether the data that is stored in the phase change storage unit and is corresponding to the indicator value is the same as the to-be-written data.

The first write circuit 404 includes a third control circuit configured to, if the same, set the enable signal to invalid, so as to stop applying the voltage pulse signal to the phase change material included in the phase change storage unit corresponding to the to-be-written data and stop applying the voltage pulse signal to the voltage divider resistor serially connected to the phase change material; and a fourth control circuit configured to, if different, continue to apply the voltage pulse signal to the phase change material included in the phase change storage unit corresponding to the to-be-written data and apply the voltage pulse signal to the voltage divider resistor serially connected to the phase change material, so as to change a status of the phase change material included in the phase change storage unit; and a third write circuit configured to, when the status of the phase change material included in the phase change storage unit changes, write the to-be-written data into the phase change storage unit corresponding to the to-be-written data.

In this embodiment of the present invention, a read/write circuit applies a generated voltage pulse signal to a phase change material included in a phase change storage unit corresponding to to-be-written data and applies the voltage pulse signal to a voltage divider resistor; voltage values at both ends of the phase change material or voltage values at both ends of the voltage divider resistor are compared with a threshold voltage to generate an indicator value; it is determined, according to the indicator value, whether data that is stored in the phase change storage unit and is corresponding to the indicator value is the same as the to-be-written data, if the same, the to-be-written data is not written into the phase change storage unit, and otherwise, the to-be-written data is written into the phase change storage unit. Compared with a process of reading data from a phase change storage unit, an operation of comparing voltage values at both ends of a phase change material or voltage values at both ends of a voltage divider resistor with a threshold voltage to generate an indicator value is simpler and consumes shorter time, thereby reducing delay time of writing data into the phase change storage unit, and improving efficiency of a write operation.

Embodiment 5

Figure 8:
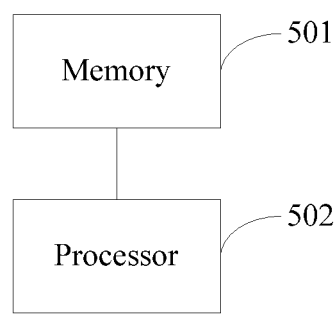
FIG. 8 is a schematic structural diagram of a write operation device for a phase change memory according to Embodiment 5 of the present invention.

This embodiment of the present invention provides a write operation device for a phase change memory. Referring to FIG. 8, the device includes a memory 501 and a processor 502, which are configured to perform a write operation method for a phase change memory described in the following, where the method includes when a phase change memory performs a write operation, generating a corresponding voltage pulse signal according to to-be-written data, and applying the voltage pulse signal to a phase change material included in a phase change storage unit corresponding to the to-be-written data and applying the voltage pulse signal to a voltage divider resistor serially connected to the phase change material; comparing voltage values at both ends of a sampling resistor with a threshold voltage to generate an indicator value, where the indicator value is corresponding to data stored in the phase change storage unit, and the sampling resistor is the voltage divider resistor or the phase change material included in the phase change storage unit; determining, according to the indicator value, whether the data that is stored in the phase change storage unit and is corresponding to the indicator value is the same as the to-be-written data; and skipping writing the to-be-written data into the phase change storage unit corresponding to the to-be-written data, if the same; or writing the to-be-written data into the phase change storage unit corresponding to the to-be-written data, if different.

The generating a corresponding voltage pulse signal according to to-be-written data, and applying the voltage pulse signal to a phase change material included in a phase change storage unit corresponding to the to-be-written data and applying the voltage pulse signal to a voltage divider resistor serially connected to the phase change material includes writing the to-be-written data into a latch included in the phase change memory; gating, according to a row address and a column address of the to-be-written data, the phase change storage unit corresponding to the to-be-written data; generating the corresponding voltage pulse signal according to the to-be-written data that is stored in the latch; and generating a valid enable signal, so as to apply the voltage pulse signal to the phase change material included in the gated phase change storage unit and apply the voltage pulse signal to the voltage divider resistor serially connected to the phase change material.

When an output end of a read/write circuit is connected to one end of the voltage divider resistor, the other end of the voltage divider resistor is connected to one end of the phase change material, and the other end of the phase change material is connected to the ground by using a switching tube included in the phase change storage unit; and the comparing voltage values at both ends of a sampling resistor with a threshold voltage to generate an indicator value includes comparing voltage values at both ends of the phase change material with the threshold voltage to generate an indicator value.

The threshold voltage is a demarcation voltage between two voltages separately presented by the phase change material when the data stored in the phase change storage unit is 0 or 1; when the data stored in the phase change storage unit is 0, the indicator value is a first value, and when the data stored in the phase change storage unit is 1, the indicator value is a second value; and the determining, according to the indicator value, whether the data that is stored in the phase change storage unit and is corresponding to the indicator value is the same as the to-be-written data includes determining, according to that the indicator value is the first value or the second value, whether the data that is stored in the phase change storage unit and is corresponding to the indicator value is the same as the to-be-written data.

Optionally, when an output end of a read/write circuit is connected to one end of the phase change material, the other end of the phase change material is connected to one end of the voltage divider resistor by using a switching tube included in the phase change storage unit, and the other end of the voltage divider resistor is connected to the ground; and the comparing voltage values at both ends of a sampling resistor with a threshold voltage to generate an indicator value includes comparing voltage values at both ends of the voltage divider resistor with the threshold voltage to generate an indicator value.

The threshold voltage is a demarcation voltage between two voltages separately presented by the voltage divider resistor when the data stored in the phase change storage unit is 0 or 1; when the data stored in the phase change storage unit is 0, the indicator value is a third value, and when the data stored in the phase change storage unit is 1, the indicator value is a fourth value; and the determining, according to the indicator value, whether the data that is stored in the phase change storage unit and is corresponding to the indicator value is the same as the to-be-written data includes determining, according to that the indicator value is the third value or the fourth value, whether the data that is stored in the phase change storage unit and is corresponding to the indicator value is the same as the to-be-written data.

The skipping writing the to-be-written data into the phase change storage unit corresponding to the to-be-written data, if the same; or writing the to-be-written data into the phase change storage unit corresponding to the to-be-written data, if different includes if the same, setting the enable signal to invalid, so as to stop applying the voltage pulse signal to the phase change material included in the phase change storage unit corresponding to the to-be-written data and stop applying the voltage pulse signal to the voltage divider resistor serially connected to the phase change material; if different, continuing to apply the voltage pulse signal to the phase change material included in the phase change storage unit corresponding to the to-be-written data and apply the voltage pulse signal to the voltage divider resistor serially connected to the phase change material, so as to change a status of the phase change material included in the phase change storage unit; and when the status of the phase change material included in the phase change storage unit changes, writing the to-be-written data into the phase change storage unit corresponding to the to-be-written data.

In this embodiment of the present invention, a read/write circuit applies a generated voltage pulse signal to a phase change material included in a phase change storage unit corresponding to to-be-written data and applies the voltage pulse signal to a voltage divider resistor serially connected to the phase change material; voltage values at both ends of the phase change material or voltage values at both ends of the voltage divider resistor are compared with a threshold voltage to generate an indicator value; and it is determined, according to the indicator value, whether data that is stored in the phase change storage unit and is corresponding to the indicator value is the same as the to-be-written data, if the same, the to-be-written data is not written into the phase change storage unit, and otherwise, the to-be-written data is written into the phase change storage unit. Compared with a process of reading data from a phase change storage unit, an operation of comparing voltage values at both ends of a phase change material or voltage values at both ends of a voltage divider resistor with a threshold voltage to generate an indicator value is simpler and consumes shorter time, thereby reducing delay time of writing data into the phase change storage unit, and improving efficiency of a write operation.

The sequence numbers of the foregoing embodiments of the present invention are merely for a description purpose but do not indicate the preference of the embodiments.

A person of ordinary skill in the art may understand that all or a part of the steps of the embodiments may be implemented by hardware or a program instructing relevant hardware. The program may be stored in a computer readable storage medium. The storage medium may include a read-only memory, a magnetic disk, or an optical disc.

The foregoing descriptions are merely exemplary embodiments of the present invention, but are not intended to limit the present invention. Any modification, equivalent replacement, and improvement made within the spirit and principle of the present invention shall fall within the protection scope of the present invention.

What is claimed is:

1. A write operation method for a phase change memory, comprising:
    generating a corresponding voltage pulse signal according to to-be-written data when the phase change memory performs a write operation;
    applying the voltage pulse signal to a phase change material comprised in a phase change storage unit corresponding to the to-be-written data when the phase change memory performs the write operation;
    applying the voltage pulse signal to a voltage divider resistor serially connected to the phase change material when the phase change memory performs the write operation;
    comparing voltage values at both ends of a sampling resistor with a threshold voltage to generate an indicator value, wherein the indicator value is corresponding to data stored in the phase change storage unit;
    determining, according to the indicator value, whether the data that is stored in the phase change storage unit and is corresponding to the indicator value is the same as the to-be-written data;
    skipping writing the to-be-written data into the phase change storage unit corresponding to the to-be-written data when the data that is stored in the phase change storage unit and is corresponding to the indicator value is the same as the to-be-written data; and
    writing the to-be-written data into the phase change storage unit corresponding to the to-be-written data when the data that is stored in the phase change storage unit and is corresponding to the indicator value is different from the to-be-written data,
    wherein generating the corresponding voltage pulse signal according to the to-be-written data, applying the voltage pulse signal to the phase change material comprised in the phase change storage unit corresponding to the to-be-written data, and applying the voltage pulse signal to the voltage divider resistor serially connected to the phase change material comprise:
        writing the to-be-written data into a latch comprised in the phase change memory;
        gating, according to a row address and a column address of the to-be-written data, the phase change storage unit corresponding to the to-be-written data;
        generating the corresponding voltage pulse signal according to the to-be-written data that is stored in the latch; and
        generating a valid enable signal to apply the voltage pulse signal to the phase change material comprised in the gated phase change storage unit and apply the voltage pulse signal to the voltage divider resistor serially connected to the phase change material.

2. The method according to claim 1, wherein the sampling resistor comprises the voltage divider resistor.

3. The method according to claim 1, wherein the sampling resistor comprises the phase change material.

4. The method according to claim 1, wherein when an output end of a read/write circuit is connected to one end of the voltage divider resistor, the other end of the voltage divider resistor is connected to one end of the phase change material, and the other end of the phase change material is connected to the ground by using a switching tube comprised in the phase change storage unit, and wherein comparing the voltage values at both ends of the sampling resistor with the threshold voltage to generate the indicator value comprises comparing voltage values at both ends of the phase change material with the threshold voltage to generate the indicator value.

5. The method according to claim 1, wherein when an output end of a read/write circuit is connected to one end of the phase change material, the other end of the phase change material is connected to one end of the voltage divider resistor by using a switching tube comprised in the phase change storage unit, and the other end of the voltage divider resistor is connected to the ground, and wherein comparing the voltage values at both ends of the sampling resistor with the threshold voltage to generate the indicator value comprises comparing the voltage values at both ends of the voltage divider resistor with the threshold voltage to generate the indicator value.

6. A write operation device for a phase change memory, comprising:
    a generating circuit configured to, when the phase change memory performs a write operation, generate a corresponding voltage pulse signal according to to-be-written data, and apply the voltage pulse signal to a phase change material comprised in a phase change storage unit corresponding to the to-be-written data and apply the voltage pulse signal to a voltage divider resistor serially connected to the phase change material;
    a comparator configured to compare voltage values at both ends of a sampling resistor with a threshold voltage to generate an indicator value, wherein the indicator value is corresponding to data stored in the phase change storage unit;
    a first control circuit configured to determine, according to the indicator value, whether the data that is stored in the phase change storage unit and is corresponding to the indicator value is the same as the to-be-written data; and
    a first write circuit configured to skip writing the to-be-written data into the phase change storage unit corresponding to the to-be-written data when the data that is stored in the phase change storage unit and is corresponding to the indicator value is the same as the to-be-written data, and write the to-be-written data into the phase change storage unit corresponding to the to-be-written data when the data that is stored in the phase change storage unit and is corresponding to the indicator value is different from the to-be-written data, wherein the generating circuit comprises:
- a second write circuit configured to write the to-be-written data into a latch comprised in the phase change memory;
- a gating circuit configured to gate, according to a row address and a column address of the to-be-written data, the phase change storage unit corresponding to the to-be-written data;
- a read/write circuit configured to generate the corresponding voltage pulse signal according to the to-be-written data that is stored in the latch; and
- a second control circuit configured to generate a valid enable signal to apply the voltage pulse signal to the phase change material comprised in the gated phase change storage unit and apply the voltage pulse signal to the voltage divider resistor serially connected to the phase change material.

7. The device according to claim 6, wherein the sampling resistor comprises the voltage divider resistor.

8. The device according to claim 6, wherein the sampling resistor comprises the phase change material.

9. The device according to claim 6, wherein when an output end of the read/write circuit is connected to one end of the voltage divider resistor, the other end of the voltage divider resistor is connected to one end of the phase change material, and the other end of the phase change material is connected to the ground by using a switching tube comprised in the phase change storage unit, and wherein the comparator is configured to compare voltage values at both ends of the phase change material with the threshold voltage to generate the indicator value.

10. The device according to claim 6, wherein when an output end of a read/write circuit is connected to one end of the phase change material, the other end of the phase change material is connected to one end of the voltage divider resistor by using a switching tube comprised in the phase change storage unit, and the other end of the voltage divider resistor is connected to the ground, and wherein the comparator is configured to compare voltage values at both ends of the voltage divider resistor with the threshold voltage to generate the indicator value.

11. A write operation method for a phase change memory, comprising:
- generating a corresponding voltage pulse signal according to to-be-written data when the phase change memory performs a write operation;
- applying the voltage pulse signal to a phase change material comprised in a phase change storage unit corresponding to the to-be-written data when the phase change memory performs the write operation;
- applying the voltage pulse signal to a voltage divider resistor serially connected to the phase change material when the phase change memory performs the write operation;
- comparing voltage values at both ends of a sampling resistor with a threshold voltage to generate an indicator value, wherein the indicator value is corresponding to data stored in the phase change storage unit;
- determining, according to the indicator value, whether the data that is stored in the phase change storage unit and is corresponding to the indicator value is the same as the to-be-written data;
- skipping writing the to-be-written data into the phase change storage unit corresponding to the to-be-written data when the data that is stored in the phase change storage unit and is corresponding to the indicator value is the same as the to-be-written data; and
- writing the to-be-written data into the phase change storage unit corresponding to the to-be-written data when the data that is stored in the phase change storage unit and is corresponding to the indicator value is different from the to-be-written data,
- wherein when an output end of a read/write circuit is connected to one end of the voltage divider resistor, the other end of the voltage divider resistor is connected to one end of the phase change material, and the other end of the phase change material is connected to the ground by using a switching tube comprised in the phase change storage unit,
- wherein comparing the voltage values at both ends of the sampling resistor with the threshold voltage to generate the indicator value comprises comparing voltage values at both ends of the phase change material with the threshold voltage to generate the indicator value,
- wherein the threshold voltage is a demarcation voltage between two voltages separately presented by the phase change material when the data stored in the phase change storage unit is zero or one,
- wherein the indicator value is a first value when the data stored in the phase change storage unit is zero,
- wherein the indicator value is a second value when the data stored in the phase change storage unit is one, and
- wherein determining, according to the indicator value, whether the data that is stored in the phase change storage unit and is corresponding to the indicator value is the same as the to-be-written data comprises determining, according to that the indicator value is the first value or the second value, whether the data that is stored in the phase change storage unit and is corresponding to the indicator value is the same as the to-be-written data.

12. A write operation method for a phase change memory, comprising:
- generating a corresponding voltage pulse signal according to to-be-written data when the phase change memory performs a write operation;
- applying the voltage pulse signal to a phase change material comprised in a phase change storage unit corresponding to the to-be-written data when the phase change memory performs the write operation;
- applying the voltage pulse signal to a voltage divider resistor serially connected to the phase change material when the phase change memory performs the write operation;
- comparing voltage values at both ends of a sampling resistor with a threshold voltage to generate an indicator value, wherein the indicator value is corresponding to data stored in the phase change storage unit;
- determining, according to the indicator value, whether the data that is stored in the phase change storage unit and is corresponding to the indicator value is the same as the to-be-written data;
- skipping writing the to-be-written data into the phase change storage unit corresponding to the to-be-written data when the data that is stored in the phase change storage unit and is corresponding to the indicator value is the same as the to-be-written data; and
- writing the to-be-written data into the phase change storage unit corresponding to the to-be-written data when the data that is stored in the phase change storage unit and is corresponding to the indicator value is different from the to-be-written data,
- wherein when an output end of a read/write circuit is connected to one end of the phase change material, the other end of the phase change material is connected to one end of the voltage divider resistor by using a switching tube comprised in the phase change storage unit, and the other end of the voltage divider resistor is connected to the ground, wherein comparing the voltage values at both ends of the sampling resistor with the threshold voltage to generate the indicator value comprises comparing the voltage values at both ends of the voltage divider resistor with the threshold voltage to generate the indicator value, wherein the threshold voltage is a demarcation voltage between two voltages separately presented by the voltage divider resistor when the data stored in the phase change storage unit is zero or one, wherein the indicator value is a third value when the data stored in the phase change storage unit is zero, wherein the indicator value is a fourth value when the data stored in the phase change storage unit is one, and wherein determining, according to the indicator value, whether the data that is stored in the phase change storage unit and is corresponding to the indicator value is the same as the to-be-written data comprises determining, according to that the indicator value is the third value or the fourth value, whether the data that is stored in the phase change storage unit and is corresponding to the indicator value is the same as the to-be-written data.

13. A write operation method for a phase change memory, comprising:
generating a corresponding voltage pulse signal according to to-be-written data when the phase change memory performs a write operation;
applying the voltage pulse signal to a phase change material comprised in a phase change storage unit corresponding to the to-be-written data when the phase change memory performs the write operation;
applying the voltage pulse signal to a voltage divider resistor serially connected to the phase change material when the phase change memory performs the write operation;
comparing voltage values at both ends of a sampling resistor with a threshold voltage to generate an indicator value, wherein the indicator value is corresponding to data stored in the phase change storage unit;
determining, according to the indicator value, whether the data that is stored in the phase change storage unit and is corresponding to the indicator value is the same as the to-be-written data;
skipping writing the to-be-written data into the phase change storage unit corresponding to the to-be-written data when the data that is stored in the phase change storage unit and is corresponding to the indicator value is the same as the to-be-written data; and
writing the to-be-written data into the phase change storage unit corresponding to the to-be-written data when the data that is stored in the phase change storage unit and is corresponding to the indicator value is different from the to-be-written data,
wherein generating the corresponding voltage pulse signal according to the to-be-written data, applying the voltage pulse signal to the phase change material comprised in the phase change storage unit corresponding to the to-be-written data, and applying the voltage pulse signal to the voltage divider resistor serially connected to the phase change material comprise:
writing the to-be-written data into a latch comprised in the phase change memory;
gating, according to a row address and a column address of the to-be-written data, the phase change storage unit corresponding to the to-be-written data;
generating the corresponding voltage pulse signal according to the to-be-written data that is stored in the latch; and
generating a valid enable signal to apply the voltage pulse signal to the phase change material comprised in the gated phase change storage unit and apply the voltage pulse signal to the voltage divider resistor serially connected to the phase change material,
wherein skipping writing the to-be-written data into the phase change storage unit corresponding to the to-be-written data when the data that is stored in the phase change storage unit and is corresponding to the indicator value is the same as the to-be-written data, and writing the to-be-written data into the phase change storage unit corresponding to the to-be-written data when the data that is stored in the phase change storage unit and is corresponding to the indicator value is different from the to-be-written data comprise:
setting the enable signal to invalid to stop applying the voltage pulse signal to the phase change material comprised in the phase change storage unit corresponding to the to-be-written data and stop applying the voltage pulse signal to the voltage divider resistor serially connected to the phase change material when the data that is stored in the phase change storage unit and is corresponding to the indicator value is the same as the to-be-written data;
continuing to apply the voltage pulse signal to the phase change material comprised in the phase change storage unit corresponding to the to-be-written data and apply the voltage pulse signal to the voltage divider resistor serially connected to the phase change material to change a status of the phase change material comprised in the phase change storage unit when the data that is stored in the phase change storage unit and is corresponding to the indicator value is different from the to-be-written data; and
writing the to-be-written data into the phase change storage unit corresponding to the to-be-written data when the status of the phase change material comprised in the phase change storage unit changes.

14. A write operation device for a phase change memory, comprising:
a generating circuit configured to, when the phase change memory performs a write operation, generate a corresponding voltage pulse signal according to to-be-written data, and apply the voltage pulse signal to a phase change material comprised in a phase change storage unit corresponding to the to-be-written data and apply the voltage pulse signal to a voltage divider resistor serially connected to the phase change material;
a comparator configured to compare voltage values at both ends of a sampling resistor with a threshold voltage to generate an indicator value, wherein the indicator value is corresponding to data stored in the phase change storage unit;
a first control circuit configured to determine, according to the indicator value, whether the data that is stored in the phase change storage unit and is corresponding to the indicator value is the same as the to-be-written data; and
a first write circuit configured to skip writing the to-be-written data into the phase change storage unit corresponding to the to-be-written data when the data that is stored in the phase change storage unit and is corresponding to the indicator value is the same as the to-be-written data, and write the to-be-written data into the phase change storage unit corresponding to the to-bewritten data when the data that is stored in the phase change storage unit and is corresponding to the indicator value is different from the to-be-written data, wherein when an output end of the read/write circuit is connected to one end of the voltage divider resistor, the other end of the voltage divider resistor is connected to one end of the phase change material, and the other end of the phase change material is connected to the ground by using a switching tube comprised in the phase change storage unit, wherein the comparator is configured to compare voltage values at both ends of the phase change material with the threshold voltage to generate the indicator value, wherein the threshold voltage is a demarcation voltage between two voltages separately presented by the phase change material when the data stored in the phase change storage unit is zero or one, wherein the indicator value is a first value when the data stored in the phase change storage unit is zero, wherein the indicator value is a second value when the data stored in the phase change storage unit is one, and wherein the first control circuit is configured to determine, according to that the indicator value is the first value or the second value, whether the data that is stored in the phase change storage unit and is corresponding to the indicator value is the same as the to-be-written data.

15. A write operation device for a phase change memory, comprising:

a generating circuit configured to, when the phase change memory performs a write operation, generate a corresponding voltage pulse signal according to to-be-written data, and apply the voltage pulse signal to a phase change material comprised in a phase change storage unit corresponding to the to-be-written data and apply the voltage pulse signal to a voltage divider resistor serially connected to the phase change material;

a comparator configured to compare voltage values at both ends of a sampling resistor with a threshold voltage to generate an indicator value, wherein the indicator value is corresponding to data stored in the phase change storage unit;

a first control circuit configured to determine, according to the indicator value, whether the data that is stored in the phase change storage unit and is corresponding to the indicator value is the same as the to-be-written data; and a first write circuit configured to skip writing the to-be-written data into the phase change storage unit corresponding to the to-be-written data when the data that is stored in the phase change storage unit and is corresponding to the indicator value is the same as the to-be-written data, and write the to-be-written data into the phase change storage unit corresponding to the to-be-written data when the data that is stored in the phase change storage unit and is corresponding to the indicator value is different from the to-be-written data, wherein when an output end of a read/write circuit is connected to one end of the phase change material, the other end of the phase change material is connected to one end of the voltage divider resistor by using a switching tube comprised in the phase change storage unit, and the other end of the voltage divider resistor is connected to the ground, wherein the comparator is configured to compare voltage values at both ends of the voltage divider resistor with the threshold voltage to generate the indicator value, wherein the threshold voltage is a demarcation voltage between two voltages separately presented by the voltage divider resistor when the data stored in the phase change storage unit is zero or one, wherein the indicator value is a third value when the data stored in the phase change storage unit is zero, wherein the indicator value is a fourth value when the data stored in the phase change storage unit is one, and wherein the first control circuit is configured to determine, according to that the indicator value is the third value or the fourth value, whether the data that is stored in the phase change storage unit and is corresponding to the indicator value is the same as the to-be-written data.

16. A write operation device for a phase change memory, comprising:

a generating circuit configured to, when the phase change memory performs a write operation, generate a corresponding voltage pulse signal according to to-be-written data, and apply the voltage pulse signal to a phase change material comprised in a phase change storage unit corresponding to the to-be-written data and apply the voltage pulse signal to a voltage divider resistor serially connected to the phase change material;

a comparator configured to compare voltage values at both ends of a sampling resistor with a threshold voltage to generate an indicator value, wherein the indicator value is corresponding to data stored in the phase change storage unit;

a first control circuit configured to determine, according to the indicator value, whether the data that is stored in the phase change storage unit and is corresponding to the indicator value is the same as the to-be-written data; and a first write circuit configured to skip writing the to-be-written data into the phase change storage unit corresponding to the to-be-written data when the data that is stored in the phase change storage unit and is corresponding to the indicator value is the same as the to-be-written data, and write the to-be-written data into the phase change storage unit corresponding to the to-be-written data when the data that is stored in the phase change storage unit and is corresponding to the indicator value is different from the to-be-written data, wherein the generating circuit comprises:

a second write circuit configured to write the to-be-written data into a latch comprised in the phase change memory;

a gating circuit configured to gate, according to a row address and a column address of the to-be-written data, the phase change storage unit corresponding to the to-be-written data;

a read/write circuit configured to generate the corresponding voltage pulse signal according to the to-be-written data that is stored in the latch; and a second control circuit configured to generate a valid enable signal to apply the voltage pulse signal to the phase change material comprised in the gated phase change storage unit and apply the voltage pulse signal to the voltage divider resistor serially connected to the phase change material, wherein the first write circuit comprises:

a third control circuit configured to, when the data that is stored in the phase change storage unit and is corresponding to the indicator value is the same as the to-be-written data, set the enable signal to invalid to stop applying the voltage pulse signal to the phase change material comprised in the phase change storage unit corresponding to the to-be-written data and stop applying the voltage pulse signal to the voltage divider resistor serially connected to the phase change material;

a fourth control circuit configured to, when the data that is stored in the phase change storage unit and is corresponding to the indicator value is different from the to-be-written data, continue to apply the voltage pulse signal to the phase change material comprised in the phase change storage unit corresponding to the to-be-written data and apply the voltage pulse signal to the voltage divider resistor serially connected to the phase change material to change a status of the phase change material comprised in the phase change storage unit; and a third write circuit configured to, when the status of the phase change material comprised in the phase change storage unit changes, write the to-be-written data into the phase change storage unit corresponding to the to-be-written data.

\* \* \* \* \*